United States Patent [19]

Thompson et al.

[11] Patent Number: 4,673,446
[45] Date of Patent: Jun. 16, 1987

[54] METHOD OF FORMING THERMALLY STABLE HIGH RESISTIVITY REGIONS IN N-TYPE INDIUM PHOSPHIDE BY OXYGEN IMPLANTATION

[75] Inventors: Phillip E. Thompson, Springfield; Harry B. Dietrich, Fairfax, both of Va.

[73] Assignee: The United States of America as represented by the Secretary of the Navy, Washington, D.C.

[21] Appl. No.: 808,699

[22] Filed: Dec. 12, 1985

[51] Int. Cl.[4] .................. H01L 21/265; H01L 21/26
[52] U.S. Cl. .................................... 148/33; 148/1.5; 148/175; 148/187; 29/571; 29/576 B
[58] Field of Search .................. 148/33, 1.5, 175, 187; 29/576 B, 571

[56] References Cited

U.S. PATENT DOCUMENTS

| 4,469,528 | 9/1984 | Berth et al. .......................... 148/1.5 |
| 4,489,480 | 12/1984 | Martin et al. ..................... 29/576 B |
| 4,505,023 | 3/1985 | Tseng et al. .......................... 29/571 |
| 4,545,824 | 10/1985 | Salvi et al. ............................ 148/1.5 |
| 4,546,540 | 10/1985 | Uenagi et al. ...................... 29/576 B |
| 4,601,095 | 7/1986 | Kikuchi et al. ....................... 29/571 |
| 4,602,965 | 7/1986 | McNally .............................. 148/1.5 |

OTHER PUBLICATIONS

Publication, Solid-State Electronics, vol. 27, No. 8/9, pp. 817-818, 1984, "Device Isolation by Oxygen Implantation in N-Type Indium Phosphide, P. E. Thompson et al.
Bhattacharya et al., J. Appl. Phys. 55 (1984), 509.
Slater et al., Rad. Effects, 83 (Dec. 84) 219.
Roach et al., J. Vac. Sci. Technol. 132 (1984) 512.
Favennec et al., Rev. Phys. Appl. 19 (Mar. 1984) 191.

Primary Examiner—Upendra Roy
Attorney, Agent, or Firm—John L. Forrest; Michael E. Melton

[57] ABSTRACT

An InP wafer, comprising a S.I. InP substrate, a n-type InP active layer disposed on the substrate and oxygen implanted isolation regions disposed in the active layer.

11 Claims, 3 Drawing Figures

METHOD OF FORMING THERMALLY STABLE HIGH RESISTIVITY REGIONS IN N-TYPE INDIUM PHOSPHIDE BY OXYGEN IMPLANTATION

BACKGROUND OF THE INVENTION

This invention relates generally to the formation of electrical isolation regions in semiconductive structures and more particularly to thermally stable isolation regions in n-type indium phosphide substrates by oxygen implantation.

The necessity for selectively forming electrically isolated regions in certain types of semiconductive structures, such as monolithic integrated circuits is generally well-known. In the absence of providing some type of electrically insulating barrier between closely spaced semiconductive devices and/or other IC components fabricated in a common semiconductive substrate, undesirable leakage currents will flow between these devices or components and degrade the electrical performance of the structure, if not render it totally inoperable.

N-type InP is considered an excellent candidate for use in the formation of integrated circuits using electro-optics due to InP's good lattice matching capabilities with wave-guide materials such as InGaAs and InGaAsP and due to InP's high saturation velocity and good carrier mobility. A great need has developed to produce high-temperature stable isolation regions in n-type InP on Fe or Cr doped InP substrates for processes in which the isolation implantation precedes the alloying of ohmic contacts. A primary reason, though, why development of n-type InP on Fe or Cr doped InP substrates has not been carried further is the general acceptance that maximum benefits are achieved with implantation of light ions (H, He, Be and B) because the depth and benefits of the damage layer are inversely related to the ion mass and light ion bombardment has been shown to produce thermally stable isolation regions up to only 300° C. Additionally, it has been shown that Hydrogen implantation into Cr doped InP produces a conductive layer. This results in a low-resistance shunt in parallel with the interdevice isolation.

OBJECTS OF THE INVENTION

Accordingly, it is an object of the present invention to form high temperature stable isolation regions in InP.

It is a further object of the present invention to provide InP wafers which allow greater flexibility in the design and fabrication of discrete devices.

It is still a further object of the present invention to provide new and improved InP semiconductor devices in n-type InP.

It is still a further object of the present invention to provide high resistivity isolation regions in InP.

It is yet still a further object of the present invention to extend the usefulness of damage-induced isolation in n-type InP by making possible processes in which the isolation implantation precedes the alloying of ohmic contacts.

It is yet still a further object of the present invention to provide n-type InP substrates without unwanted conductive layers.

Other objects, advantages, and novel features of the present invention will become apparent from the detailed description of the invention, which follows the summary.

SUMMARY OF THE INVENTION

Briefly, the above and other objects are realized by an InP wafer comprising a S.I. InP substrate; a n-type InP active layer disposed on the substrate; and oxygen ion implanted isolation regions disposed in the active layer.

In a preferred embodiment, the S.I. InP dopant may comprise either Fe or Cr.

DETAILED DESCRIPTION OF THE PREFERRED EMBODIMENT

The present invention is based on the fact that the ion implantation process changes the chemical composition of the near-surface region of a solid and introduces radiation damage into this region. These changes provide the possibility of modifying an extremely wide range of near-surface physical and chemical properties of solids, including region resistivity.

The principle of inducing the present damage regions is based on the above-described radiation reaction from the oxygen ion implantation in a n-type InP active layer. It has been discovered that when oxygen ions of a sufficient energy are directed toward a n-type InP crystal surface, they will penetrate the surface and measurably affect the resistivity and form high temperature stable isolation regions.

Figure 1:
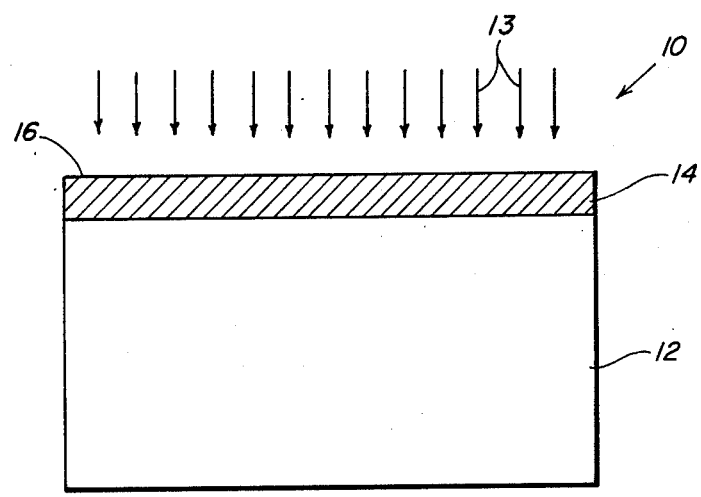
FIG. 1 is a schematic cross section of a InP wafer before formation of isolation regions.

Referring now to the drawings, wherein like reference numerals designate identical or corresponding parts throughout the several views, and more particularly to FIG. 1 thereof, there is disclosed an InP wafer 10 of the present invention comprising a substrate 12 of semi-insulating (S.I.) InP. Substrate 12 is made semi-insulating by compensating the background impurity concentration with either Fe or Cr.

An active layer 14 is formed by ion implanting silicon ions 13 on the S.I. InP substrate 12 to a uniform concentration of $2 \times 10^{17}$ carriers/cm$^3$. The method of forming active layer 14 is not limited to ion implantation and may be formed by a variety of techniques, such as Vapor Phase Epitaxy (VPE), Molecular Beam Epitaxy (MBE), Liquid Phase Epitaxy (LPE), or Metal Organic Chemical Vapor Deposition (MOCVD).

Prior to ion implantation, substrate 12 is polished using conventional chemical polish techniques in order to provide a smooth damage-free upper surface onto which silicon ions are projected. Silicon ions are accelerated onto the substrate 12 under the influence of accelerating potentials typically ranging from 30 to 300 KeV. In a preferred embodiment, the silicon implantation process is carried out by implanting silicon ions at three successive dosages and fluences of 300 KeV, $5.4 \times 10^{12}$/cm$^2$; 120 KeV, $2.0 \times 10^{12}$/cm$^2$; and 30 KeV, $0.7 \times 10^{12}$/cm$^2$ respectively. This technique enables the formation of a thin silicon implanted active layer 14 having both an uniform thickness and uniform carrier concentration on the order of $2 \times 10^{17}$ carriers/cm$^3$ over a depth of approximately 6000 Angstroms Wafer 10 is then thoroughly cleaned with successive applications of TCE, Acetone, isopropyl alcohol, deionized water, HF and deionized water. Active layer 14 is then coated Si3N4 (not shown) by plasma assisted CVD to a depth of approximately 1000 Angstroms. This coating step (encapsulation) serves to prevent phosphorus from diffusing out of active layer 14 during the subsequent annealing process.

Figure 2:
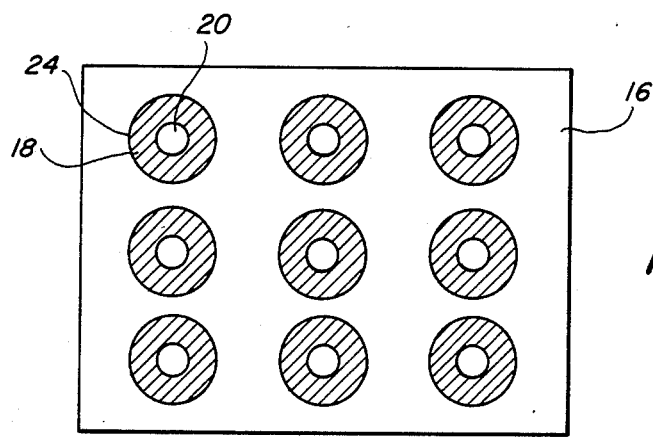
FIG. 2 is a schematic top view of a InP wafer in accordance with the present invention.

An annealing process is performed by transferring wafer 10 shown in FIG. 2 to an anneal furnace wherein the temperature is elevated to approximately 700° C. in a flowing gas (90% N2: 10% H2) atmosphere for approximately 15 minutes. This step serves to electrically activate the implanted silicon atoms and also to anneal the implantation caused lattice defects which would otherwise excessively reduce carrier mobilities in the structure. The Si3N4 encapsulation layer is subsequently removed in a bath of HF acid.

Wafer surface 16 is then covered with a thin layer of photoresist (not shown), which is patterned using standard photolithographic techniques, forming donut ring patterns 18 shown in FIG. 2. AuGe/Au, approximately 1000 Angstroms thick is then evaporated onto wafer surface 16. Formation of contact regions 20 is achieved by removing the remaining photoresist from ring patterns 18 which concurrently removes the AuGe/Au from the ring pattern area 18 leaving AuGe/Au contact areas 20 and surface area 16. The wafer is then heated to approximately 400° C. for 30 seconds to alloy the AuGe/Au with the InP surface 16.

Two microns of SiO2 is deposited on top of the AuGe/Au contact regions 20 and surface area 16 to act as an implantation mask. This ion implantation mask is formed using standard photo-lithographic techniques. A photoresist pattern (not shown) is formed atop the SiO2 layer and has openings therein corresponding to donut ring patterns 18. Hydrofluoric acid, HF, is then applied to the portions of the SiO2 layer which are exposed by the resist pattern in order to create the donut patterns 18 as the exposed SiO2 is etched away by the HF. These processing techniques are well known in the art and will therefore not be described in further detail herein.

The masked structure is reintroduced into a suitable ion implantation chamber where oxygen ions are accelerated into the structure under the influence of accelerating potentials ranging from 20 to 300 KeV and fluences ranging from $0.09 \times 10^{12}$ oxygen ions/cm$^2$ to $4.6 \times 10^{15}$ oxygen ions/cm$^2$. The maximum energy of the oxygen ions determines the implantation depth in InP active layer 14. The resulting implanted isolation regions should extend throughout the active layer 14 and into the InP substrate 12 to ensure maximum electrical isolation. In a preferred embodiment, to ensure an even distribution of oxygen ions throughout the active layer 14, oxygen accelerating potentials and fluences of 300 KeV, $0.24 \times 10^{12}$/cm$^2$; 140 KeV, $0.46 \times 10^{12}$/cm$^2$; 60 KeV, $0.24 \times 10^{12}$/cm$^2$; and 20 KeV, $0.09 \times 10^{12}$/cm$^2$ respectively, are applied in successive applications.

A control region can be created by masking one half of wafer 10 with a sheet of aluminum foil. The aluminum foil prevents the oxygen beam from striking the wafer surface 16. This step would not be utilized in a device application and is discussed only for purposes of demonstrating the dielectric isolation which results due to the oxygen implantation damage.

The I-V characteristics measured between the center of donut ring pattern 18 and its perimeter 24 are linear. The resistivity of the region is measured by the equation $$\rho = 2\pi RT [\text{Ln} (R_B/R_A)]^{-1} \quad (1)$$

where R is the resistance measured across donut ring pattern 18; T is the thickness of active layer 14; $R_a$, $R_B$ is the inside, outside radii of ring pattern 18, 58 and 110 microns respectively in a preferred embodiment. The height of rings 18 is approximately 1000 Angstroms.

The maximum resistivity value of $10^3$ ohm. cm is characteristic of the maximum resistivity achieved with light ion implantation.

The implantation damage induced isolation is thermally stable up to temperatures of 450° C. The resistivity tapers at temperatures above 450° C. with abrupt decreases occurring around 500° C. This thermal stability range is a technologically important feature compared to present thermal stability up to 300° C. with light ion implantation.

Figure 3:
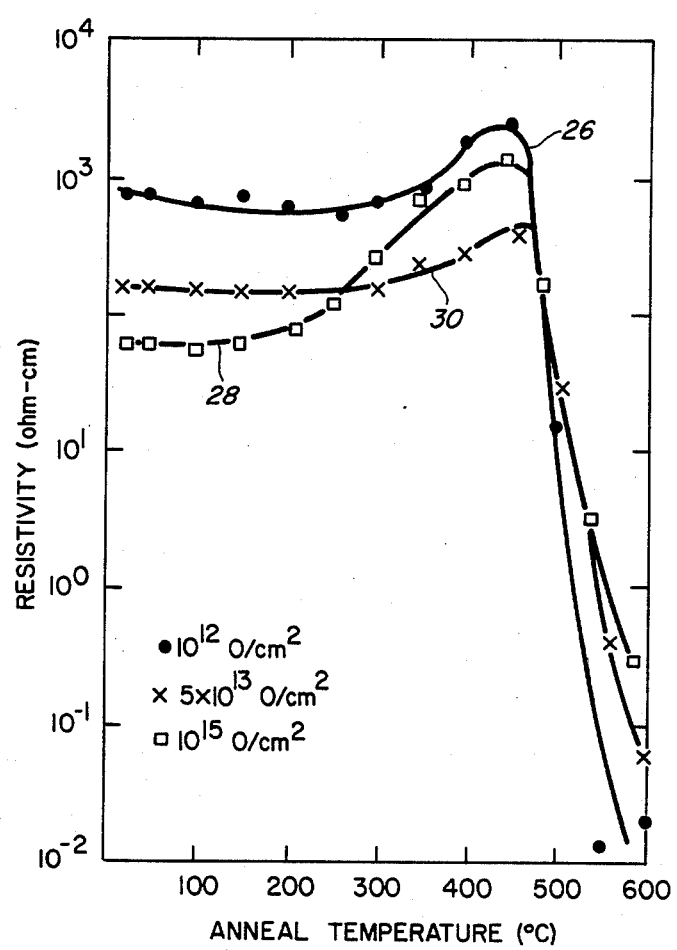
FIG. 3 is a graph of isolation region resistivity vs. anneal temperature for the wafer of the present invention.

The thermal stability of the oxygen implanted InP is presented in FIG. 3 as a function of anneal temperature for three oxygen fluences $10^{12}$ oxygen ions/cm$^2$, line 26; $10^{15}$ oxygen ions/cm$^2$, line 28; and $5 \times 10^{13}$ oxygen ions/cm$^2$, line 30. Line 26 shows stability exceeding 450° C.

This increased thermal stability of the damage-induced isolation regions makes possible processes in which the isolation implantation precedes thermal processing up to 450° C., such as the alloying of ohmic contacts.

The values and ranges discussed herein are given for an active layer thickness of 6000 Angstroms, of course these values will vary with variations in active layer thickness.

Obviously, many modification and variations of the present invention are possible in light of the above teachings. For example, isolation regions 18 need not be in the form of ring patterns and can take a variety of shapes. It is therefore to be understood that within the scope of the appended claims, the invention may be practiced otherwise than as specifically described.

What is claimed and desired to be secured by Letters Patent of the Unites States is:

1. A method of forming thermally stable high resistivity isolation regions in a n-type InP active layer disposed on a S.I. InP substrate wafer comprising the step of forming selected regions of said active layer with oxygen ions, said regions extending into said S.I. InP substrate.

2. The method of claim 1, wherein said S.I. InP substrate dopant comprises Fe.

3. The method of claim 1, wherein said S.I. InP substrate dopant comprises Cr.

4. The method of Clam 1, wherein said active layer donor dopant comprises Si.

5. The method of claim 1, further including the step of forming ohmic contacts on selected regions of said active layer.

6. The method of claim 1 further including the step of forming a n-type InP active layer on a polished smooth damage free substrate wafer surface.

7. The method of claim 6 further including the steps of
coating a cleaned n-type InP active layer with Si3N4;
annealing said wafer; and
removing said Si3N4 coating.

8. The method of claim 7 further including the step of outlining at least one circular donut ring pattern on said active layer surface.

9. The method of claim 8 further including the step of forming AuGe/Au contact regions on selected regions of said active layer surface.

10. The method of claim 9 further including the step of forming an ion implantation mask on the surface of said active layer to mask all areas of said active layer surface except said donut ring patterns.

11. A method of forming thermally stable high resistivity isolation regions in an active layer of n-type InP disposed on a semiinsulating InP substrate wafer comprising the steps of, providing a substrate wafer of semi-insulating InP;
polishing said substrate to provide a smooth damage free surface;
forming a n-type InP active layer on said smooth damage free substrate wafer surface;
cleaning said wafer;
coating said n-type InP active layer with $Si_3N_4$;
annealing said wafer;
removing said $Si_3N_4$ coating;
outlining at least one donut ring pattern on said active layer;
forming AuGe/Au contact regions subsequent to outlining said donut ring patterns;
forming an ion implantation mask on the surface of said active layer to mask all areas of said active layer surface except said donut ring patterns; and
accelerating oxygen ions into said exposed donut pattern areas to form high resistivity isolation regions, said isolation regions extending throughout said active layer into said semi-insulating substrate.

* * * * *